(12) United States Patent
Valdes Garcia et al.

(10) Patent No.: US 10,430,700 B1
(45) Date of Patent: Oct. 1, 2019

(54) GRAPHENE-BASED MICRO-SCALE IDENTIFICATION SYSTEM

(71) Applicant: INTERNATIONAL BUSINESS MACHINES CORPORATION, Armonk, NY (US)

(72) Inventors: Alberto Valdes Garcia, Chappaqua, NY (US); Dirk Pfeiffer, Croton on Hudson, NY (US); Fengnian Xia, Plainsboro, NJ (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 16 days.

(21) Appl. No.: 16/118,975

(22) Filed: Aug. 31, 2018

Related U.S. Application Data

(63) Continuation of application No. 15/145,998, filed on May 4, 2016.

(51) Int. Cl.
*G06K 19/02* (2006.01)
*C23C 16/26* (2006.01)
*C23C 16/56* (2006.01)

(52) U.S. Cl.
CPC .............. *G06K 19/02* (2013.01); *C23C 16/26* (2013.01); *C23C 16/56* (2013.01)

(58) Field of Classification Search
CPC .............. G01N 21/01; G06K 19/06037; G06K 9/00201; G06K 9/6202; C23C 14/042; C23C 16/401; C23C 14/081; C23C 14/18; C23C 14/246; C23C 14/28; C23C 14/5873; C23C 16/402; C23C 28/322
See application file for complete search history.

(56) References Cited

U.S. PATENT DOCUMENTS

| | | | |
|---|---|---|---|
| 9,734,444 | B2 | 8/2017 | Fujimoto |
| 2009/0001709 | A1 | 1/2009 | Kretschmar et al. |
| 2012/0190386 | A1 | 7/2012 | Anderson |
| 2013/0087705 | A1 | 4/2013 | Hiura et al. |

(Continued)

FOREIGN PATENT DOCUMENTS

| | | | |
|---|---|---|---|
| EP | 2345071 B1 | | 5/2013 |
| WO | 2010036210 A1 | | 4/2010 |

(Continued)

OTHER PUBLICATIONS

Abadal et al., "Graphene-enabled Wireless Networks-on-Chip," accepted for publication in IEEE Communications Magazine (2012).

(Continued)

*Primary Examiner* — David P Porta
*Assistant Examiner* — Fani Boosalis
(74) *Attorney, Agent, or Firm* — Patent Porfolio Builders PLLC

(57) ABSTRACT

A system for labeling an object uses at least one object label made from a material that absorbs and reflects incident energy uniformly across all wavelengths of incident energy at a ratio proportional to a thickness of the material and that includes a pattern having variations in the thickness of the material along at least one of two orthogonal directions across the label. An interrogator directs a predetermined wavelength of radiation to the at least one label, and a reader to receives reflected radiation from the label at the predetermined wavelength and interprets the reflected radiation to recognize the pattern.

17 Claims, 7 Drawing Sheets

(56) References Cited

U.S. PATENT DOCUMENTS

| | | |
|---|---|---|
| 2013/0099196 A1 | 4/2013 | Wu et al. |
| 2013/0099205 A1 | 4/2013 | Liu et al. |
| 2014/0145426 A1 | 5/2014 | Lettow et al. |
| 2015/0028578 A1 | 1/2015 | Pawlik et al. |
| 2016/0207345 A1 | 7/2016 | Farmer et al. |

FOREIGN PATENT DOCUMENTS

| | | |
|---|---|---|
| WO | 2012064292 A1 | 5/2012 |
| WO | 2012170099 A2 | 12/2012 |
| WO | 2013059457 A1 | 4/2013 |

OTHER PUBLICATIONS

Xia et al., "The Interaction of Light and Graphene: Basics, Devices, and Applications," Proceedings of the IEEE, Jul. 2013, vol. 101, No. 7, pp. 1717-1731.

List of IBM Patents or Patent Applications Treated as Related.

GRAPHENE-BASED MICRO-SCALE IDENTIFICATION SYSTEM

CROSS-REFERENCE TO RELATED APPLICATIONS

The present application is a continuation of U.S. patent application Ser. No. 15/145,998, filed May 4, 2016, the entire disclosure of which is incorporated herein by reference.

STATEMENT REGARDING FEDERALLY SPONSORED RESEARCH OR DEVELOPMENT

This invention was made with Government support under Contract No.: FA8650-09-C-7924 awarded by the Defense Advanced Research Projects Agency (DARPA). The Government has certain rights in this invention.

FIELD OF THE INVENTION

The present invention relates to machine-readable object labeling systems.

BACKGROUND OF THE INVENTION

Machine readable labeling technologies include optical barcodes, radio frequency identification (RFID) tags and physically un-clonable electronic functions (PUFs). Labels are placed on or inside an object, and the label is read using an appropriate machine reader. These labels are used for the identification and tracking of the objects to which they are attached.

Certain objects are very small, such as integrated circuits and other electronic components, and these conventional machine readable technologies may not be compatible with very small objects or may require significant and costly modifications to work in small objects. In addition, certain labeling applications require labeling and traceability of objects such that the existence of the label is not readily apparent for security purposes. Existing technologies such as optical barcodes do not provide for this type of secure labeling.

Therefore, an object label and labeling system are desired that works with large objects and very small objects such as integrated circuits and electronic components. The label can be placed on either an exterior surface of the object or within the interior of the object. The labeling system would provide millions of unique label identifiers with a very low or zero probability of duplicate label identifiers.

SUMMARY OF THE INVENTION

Exemplary embodiments provide an object labeling and identification system that utilizes a plurality of labels where each label has a unique two-dimensional pattern associated with a unique identifier. The two-dimensional pattern is formed by varying the thickness of the label in a third dimension that is perpendicular to the each of the two orthogonal dimensions in the two-dimensional pattern. The thickness is varied when moving in at least one of two orthogonal directions in the two-dimensional pattern. The label is constructed of a material where the amount of incident interrogating radiation that is absorb or reflected by the material varies with the thickness of that material. Therefore, the thickness of the material of the label varies when moving across the label in at least one of the two orthogonal directions, defining the two-dimensional pattern. The resulting variations in reflected energy from the label correspond to the two-dimensional pattern of the label and are read and interpreted by a reader to determine the unique identifier associated with the label.

In one embodiment, the label is constructed of a plurality, n, of layers of graphene. The thickness of the label varies by at least one graphene layer along at least one of the two orthogonal directions across the surface. This variation in the number of graphene layers provides the unique label pattern of each layer. In one embodiment, the number of graphene layers is two, i.e., a bi-layer graphene label, and the pattern is created by provided portions having only a single layer of graphene. These portions can be on the order of tens of microns long or wide.

The label with the unique identifier is placed or created on the object to be identified, for example, using a vapor deposition process. The labeling system includes an interrogator which directs a desired wavelength of radiation toward the label and a reader which detects the reflected energy. The interrogating wavelength of radiation is chosen to be sufficient to resolve the pattern created by the portions having fewer graphene layers. As the interrogator and reader scan the surface of the label, the variations in the label thickness, i.e., the number of graphene layers, are read as variations in the magnitude of the reflected energy. These variations form a pattern and are converted to digital information indicative of the unique pattern on the label. The label can be fabricated or placed on the object such that the unique patterns in each label, i.e., the layer variations, occur according to a pre-defined pattern or a random pattern.

Exemplary embodiments are directed to an object label constructed from a material that absorbs and reflects incident energy at a ratio proportional to a thickness of the material. Suitable materials include, but are not limited to graphene. The object label includes a pattern made from variations in the thickness of the material along at least one of two orthogonal directions across the label. In one embodiment, the material absorbs and reflects incident energy uniformly across all wavelengths of incident energy. In one embodiment, the object label includes a plurality of individual layers, and each individual layer in the plurality of individual layers has an individual layer thickness of about a single atom. In one embodiment, the plurality of individual layers is formed as two layers of the material. In one embodiment, the variations in the thickness of the material represent changes a number of individual layers of the material. For example, the changes in the number of individual layers of the material represent a single layer change in the number of individual layers. In one embodiment, each variation in the thickness extends a given length of less than about 100 µm along one of the two orthogonal directions. In one embodiment, the object label has an overall thickness of less than about 5 nm and an area of less than about 1000 µm². In one embodiment, the object label is optically transparent.

Exemplary embodiments are also directed to a system for labeling an object. The system includes at least one object label constructed from a material that absorbs and reflects incident energy uniformly across all wavelengths of incident energy at a ratio proportional to a thickness of the material. The object label is a pattern made from variations in the thickness of the material along at least one of two orthogonal directions across the label. The system includes an interrogator to direct a predetermined wavelength of radiation to the at least one label and a reader to receive reflected radiation from the at least one label at the predetermined wavelength and to interpret the reflected radiation to recognize the pattern. In one embodiment, the system further includes a vapor deposition system to create the pattern while depositing the material on the object. In addition to a single object label, the system can include a plurality of object labels. Each object label contains a unique pattern and is associated with a unique object. Suitable materials for the label include graphene. In one embodiment, the label includes a plurality of individual layers of the material. Each individual layer in the plurality of individual layers has an individual layer thickness of about a single atom. The variations in the thickness of the material represent changes in the number of individual layers of the material. In one embodiment, each variation in the thickness extends a given length of less than about 100 μm along one of the two orthogonal directions, and the object label has an overall thickness of less than about 5 nm and an area of less than about 1000 μm².

Exemplary embodiments are also directed to a method for labeling an object. The method includes forming a material having at least two layers of graphene on an object. The graphene absorbs and reflects incident energy uniformly across all wavelengths of incident energy at a ratio proportional to a number of layers of the graphene. The method further includes forming a unique pattern in the material. The unique pattern includes variations in the number of layers of the graphene along at least one of two orthogonal directions across the material. In one embodiment, vapor deposition is used to form the at least two layers of graphene and to form the unique pattern in the material. In one embodiment, the material is formed on an interior surface of the object, which has optically opaque exterior surfaces.

DETAILED DESCRIPTION

Figure 1:
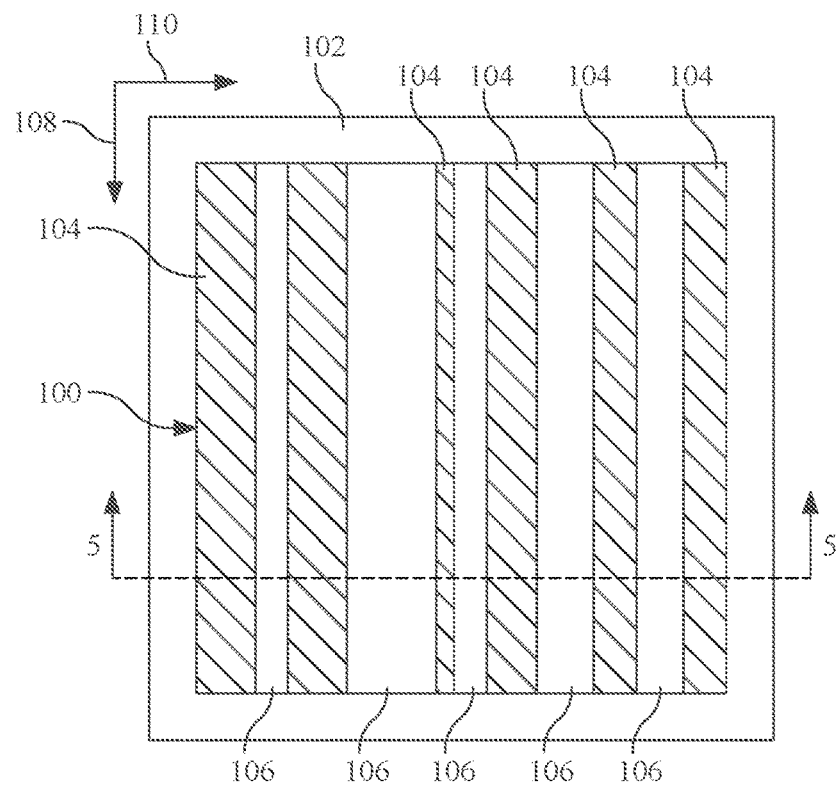
FIG. 1 is a schematic representation illustrating an embodiment of an object label on an object in accordance with the present invention.

Referring initially to FIG. 1, exemplary embodiments are directed to an object label 100 for mounting or forming on the surface of an object 102. The object label can be mounted on any suitable object including, but not limited, to integrated circuits, electronic and electrical components, computers, books, automobile components, communication equipment including cellular phones and smart phones, windows, walls, doors, keys, metals, tools, precious and semi-precious stones, jewelry, currency, consumer products, boxes, letters, envelopes, packaging, product labels, pictures including photographs and credit cards or smart cards. In general, any object that requires identification, tracking, tracing, locating, securing and inventorying can be used in conjunction with embodiments of the object label. In particular, the object label is used in applications where automated or machine reading of a label is desired or utilized. The object label can be placed on an exterior surface of the object and can be optically visible or optically invisible, i.e., not detectable in visible domain wavelengths. Alternatively, the object label can be located within or internal to the object.

The object label is constructed of a material that reflects desired wavelengths of energy that are incident upon the label. In order to associate a pre-defined or random unique identifier with the object label, materials are selected that having properties that can be exploited to create differential reflection of the incident energy. In one embodiment, the material absorbs a portion of the incident energy and reflects a portion of the incident energy. This defines a ratio of absorbed to reflected incident energy, and the material is selected such that this ratio of absorbed to reflected incident energy varies with the thickness of the material. In one embodiment, the object provides the reflective surface, and the material thickness produces different amounts of absorption of the energy reflected from the surface of the object. In one embodiment, the material absorbs and reflects incident energy uniformly across all wavelengths of incident energy. Alternatively, the material is configured to exhibit a much higher absorption at a particular wavelength or narrow range of wavelengths, which produces a label with increased security as scanner capable of producing and reading that particular wavelength would be required. Suitable materials include, but are not limited to, graphene. In general, graphene is a single layer of pure carbon that contains a tightly packed layer of carbon atoms bonded together in a hexagonal honeycomb lattice.

The properties of the material are used to create a pattern comprising variations in the thickness of the material along at least one of two orthogonal directions across the label, i.e., a first direction 110 and a second direct 108 perpendicular to the first direction. Both of the two orthogonal directions are also perpendicular to the thickness or to the direction of the variations in thickness of the material. As illustrated, the pattern includes a first thickness 104 and a second thickness 106 that is less than the first thickness. The variations between the first and second thickness occur when scanning across the label in the first direction. Therefore, the first and second thicknesses extend along the label in the second direction. The result is a pattern having a plurality of parallel lines that vary in width as measured in the first direction. The object label has a pattern that appears in two-dimensions based on the variation in material thickness in a third direction. Thus, the object label is a three dimensional structure, but the object label is effectively two-dimensional in particular given the small overall thickness of the object label in particular relative to the overall area of the object label.

Figure 2:
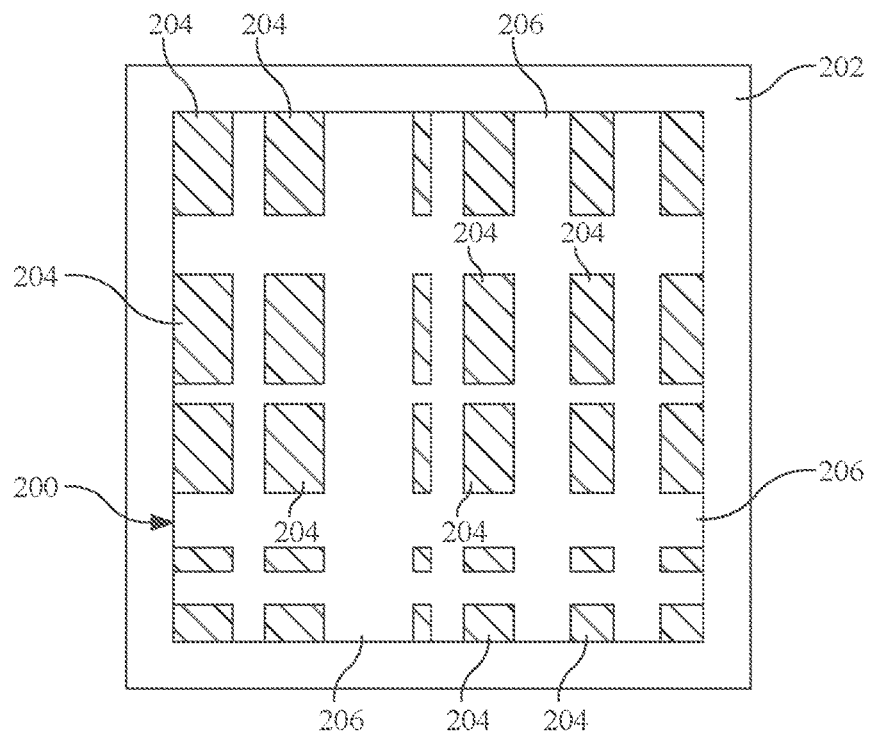
FIG. 2 is a schematic representation illustrating another embodiment of an object label on an object in accordance with the present invention.
Figure 3:
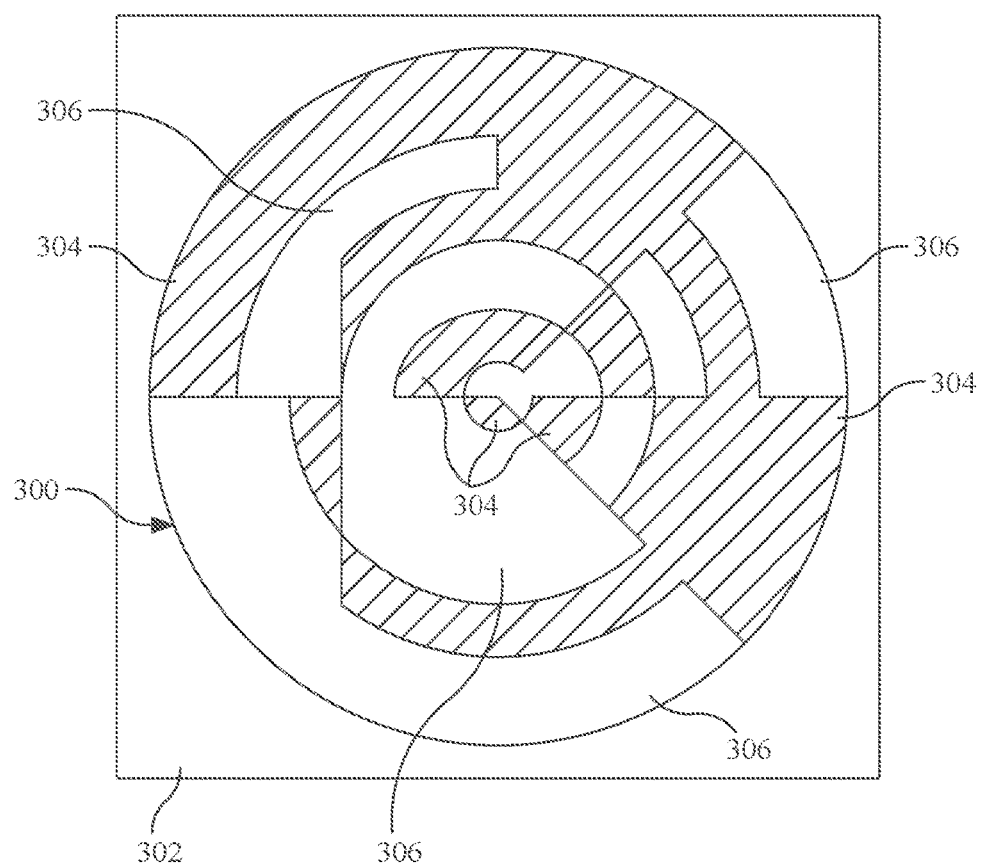
FIG. 3 is a schematic representation illustrating yet another embodiment of an object label on an object in accordance with the present invention.

Referring to FIG. 2, an embodiment of the object label 200 mounted on an object 202 is illustrated having a pattern with areas of a first thickness 204 and areas of a second thickness 206 that is less than the first thickness. In this embodiment, the variations between the first and second thickness occur when moving across the label in both the first direction and the second direction. The illustrated geometries are rectangular, and the illustrated transitions are straight lines. However, suitable patterns on the object label are not limited to these geometries. Referring to FIG. 3, an embodiment of the object label 300 mounted on an object 302 is illustrated with a circular geometry and curved lines for the transitions between the different thicknesses of the label material. As illustrated, the object label has a pattern with areas of a first thickness 304 and areas of a second thickness 306 that is less than the first thickness. In this embodiment, the variations between the first and second thickness occur when moving across the label in both the first direction and the second direction.

Figure 4:
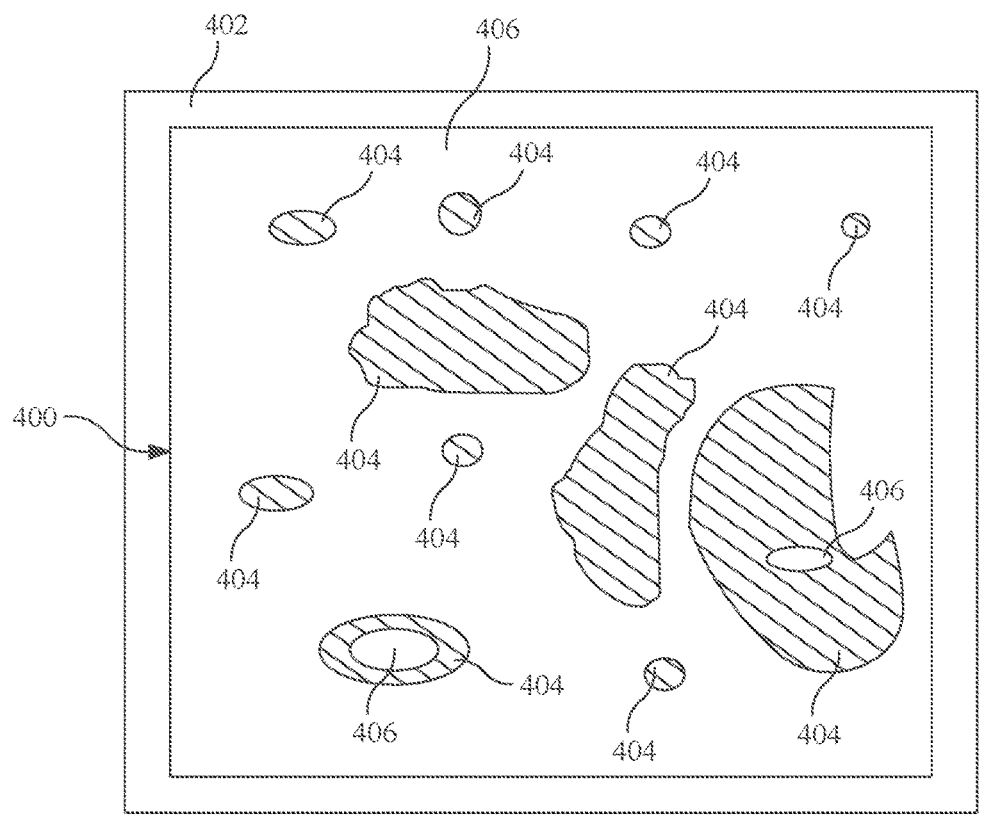
FIG. 4 is a schematic representation illustrating yet another embodiment of an object label on an object in accordance with the present invention.

In addition to regular or uniform types of geometries, the pattern on the object label can be formed form random shapes and geometries. The randomness of the geometry used to create the pattern is not analogous to the randomness of the pattern itself. Random patterns, and the associated unique patterns and object identifiers, can be created using regular geometries, i.e., rectangular, circular, curved and rectilinear, or random geometries. Similarly, regular geometries and random or irregular geometries can be used to created identical or repeated patterns. Referring to FIG. 4, an embodiment of the object label 400 mounted on an object 402 is illustrated with a random or irregular geometry for the transitions between the different thicknesses of the label material. As illustrated, the object label has a pattern with areas of a first thickness 404 and areas of a second thickness 406 that is less than the first thickness. In this embodiment, the variations between the first and second thickness occur when moving across the label in both the first direction and the second direction. The irregular geometry and resulting pattern can be the result of the method and conditions used to create the object label on the object.

Regardless of the type of pattern used on the label or the geometries used in the pattern, the object label is sized to fit on the object or the portion of the object to which the object label is attached. Therefore, the object label can have a relatively small size suitable for placement, for example, on or within integrated circuit components. In one embodiment, the object label has an area of less than about 1000 µm². However, the object label can be used for much larger or macro applications such as, for example, doors or walls. In these embodiments, the dimensions of the label are on the order of one or more meters, and the area of the object label is on the order of square meters. Graphene, in particular, is a material that scales well on both the micro scale and the macro scale and can be used across all desired sizes of object labels.

Figure 5:
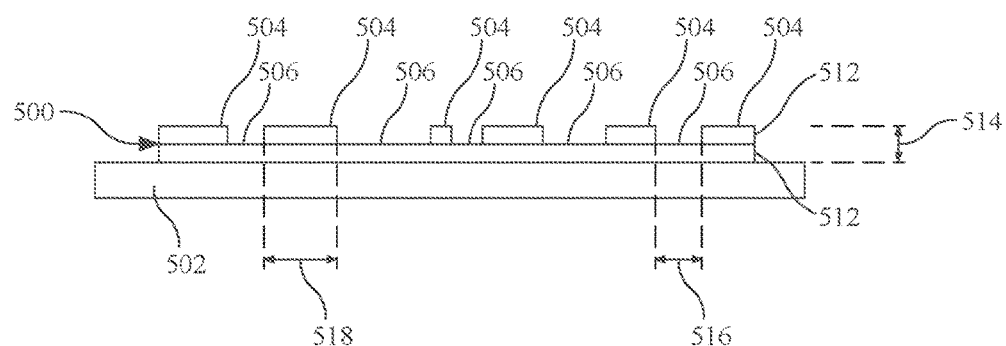
FIG. 5 is a schematic representation illustrating a cross-section of an embodiment of an object label on an object as indicated by line 5-5 in FIG. 1.

Referring to FIG. 5, an elevation or cross-sectional view of an embodiment of the object label 500 mounted on an object 502 is illustrated. As illustrated, the object label has a pattern with areas of a first thickness 504 and areas of a second thickness 506 that is less than the first thickness. In one embodiment, the object label has an overall thickness 514 of less than about 5 nm. The object label is constructed of a plurality of individual layers 512 of the material. Variations in the thickness of the material and therefore the resulting pattern of the object label are achieved through changes in the number of individual layers of the material. As illustrated, the object label includes two layers of material with the first thickness 504 in the pattern having two layers and the second thickness 506 in the pattern having on a single layer of material. Therefore, the pattern is achieved through a single layer change in the number of individual layers.

Each individual layer in the plurality of individual layers also has a thickness. This individual layer thickness can be constant for all layers or can vary from layer to layer. In one embodiment, each individual layer thickness is about a single atom. In addition, the length or run of any given thickness, including the length of any first thicknesses 518 and the length of any second thickness 516, can vary across the object label. In one embodiment, each variation in the thickness extends a given length of less than about 100 µm along one of the two orthogonal directions.

Figure 6:
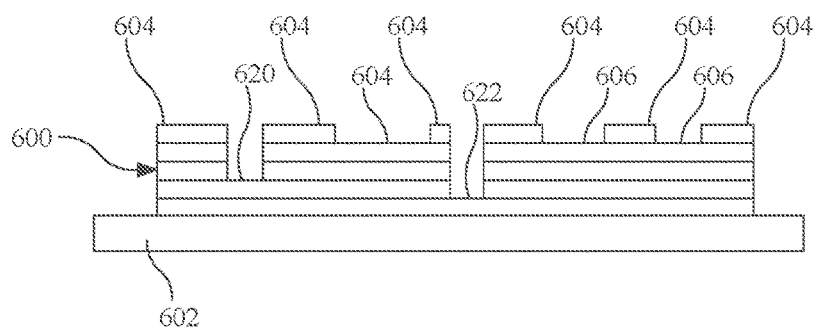
FIG. 6 is a schematic representation illustrating a cross-section of another embodiment of an object label on an object.

The object label is not limited to merely two layers or material, and any number of layers can be used. In addition, the label is not limited to having two different label thicknesses. Referring to FIG. 6, an elevation or cross-sectional view of an embodiment of the object label 600 mounted on an object 602 is illustrated. As illustrated, the object label has a pattern with areas of a first thickness 604 and areas of a second thickness 606 that is less than the first thickness. In addition, the object label includes a third thickness 620 and a fourth thickness 622 less than the third thickness. Both the third and fourth thicknesses are less than the second thickness. The variations in thicknesses can also form a stair-step pattern, and the transitions between adjacent thicknesses do not have to extend perpendicularly away from the surface of the object. In addition, the transitions between adjacent thicknesses can be curved lines.

Figure 7:
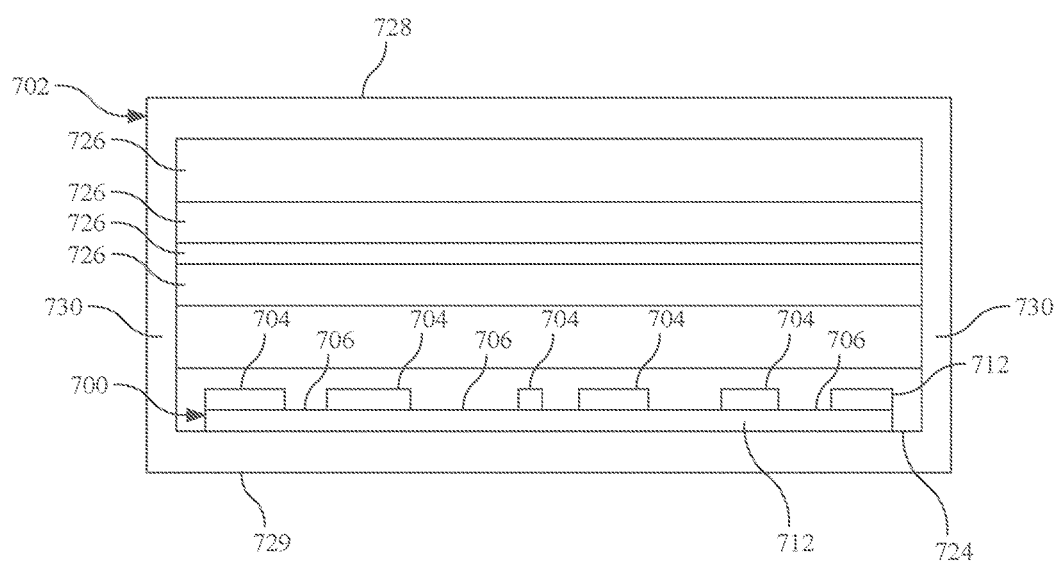
FIG. 7 is a schematic representation illustrating a cross-section of an embodiment of an object label mounted on an interior surface of an object.

The object label can be applied to exterior surface of the object to be labeled. Therefore, the object label is visible. For security or aesthetic purposes, the object label can be hidden from view. In one embodiment, the object label is optically transparent, i.e., the object label is effectively transparent in the visible light domain but readable at lower or higher wavelengths. Referring to FIG. 7, in another embodiment, the object label 700 is attached to an interior surface 724 of an object 702. The object label includes the plurality of layers 712 as well as the first thickness 704 and second thickness 706 that define the pattern associated with the object label. The object can also include one or more additional layers 726 or internal structures. In one embodiment, at least one of the exterior surfaces 728, 729 of the object or one or more of the additional interior layers or structures are opaque. While the exterior surfaces are illustrated as completely surrounding all of the interior components, in one IC embodiment, the exterior surfaces would only include a first material 729 on the bottom and a separate second material 728 on the top where the scanner applies the energy. There would not be side exterior surfaces 730 extending between the first and second materials. The first and second materials can be the same material or different materials. Therefore, the object label is hidden from view. These opaque surface, however, are transparent to the wavelengths of energy or radiation used to interrogate the object label. As the material of the object will selectively absorb or reflect energy based on thickness across all wavelengths of incident energy, a wide range of incident energies can be used to interrogate the object label, including energies outside the visible spectrum. In one exemplary embodiment, the object is an IC having a bottom layer 729 containing silicon with metal on top. The object label, e.g., the graphene label is placed on top of this layer, and the object label is covered with IC packaging materials that are opaque in the visible domain but transparent at other wavelengths such as THz wavelengths.

Figure 8:
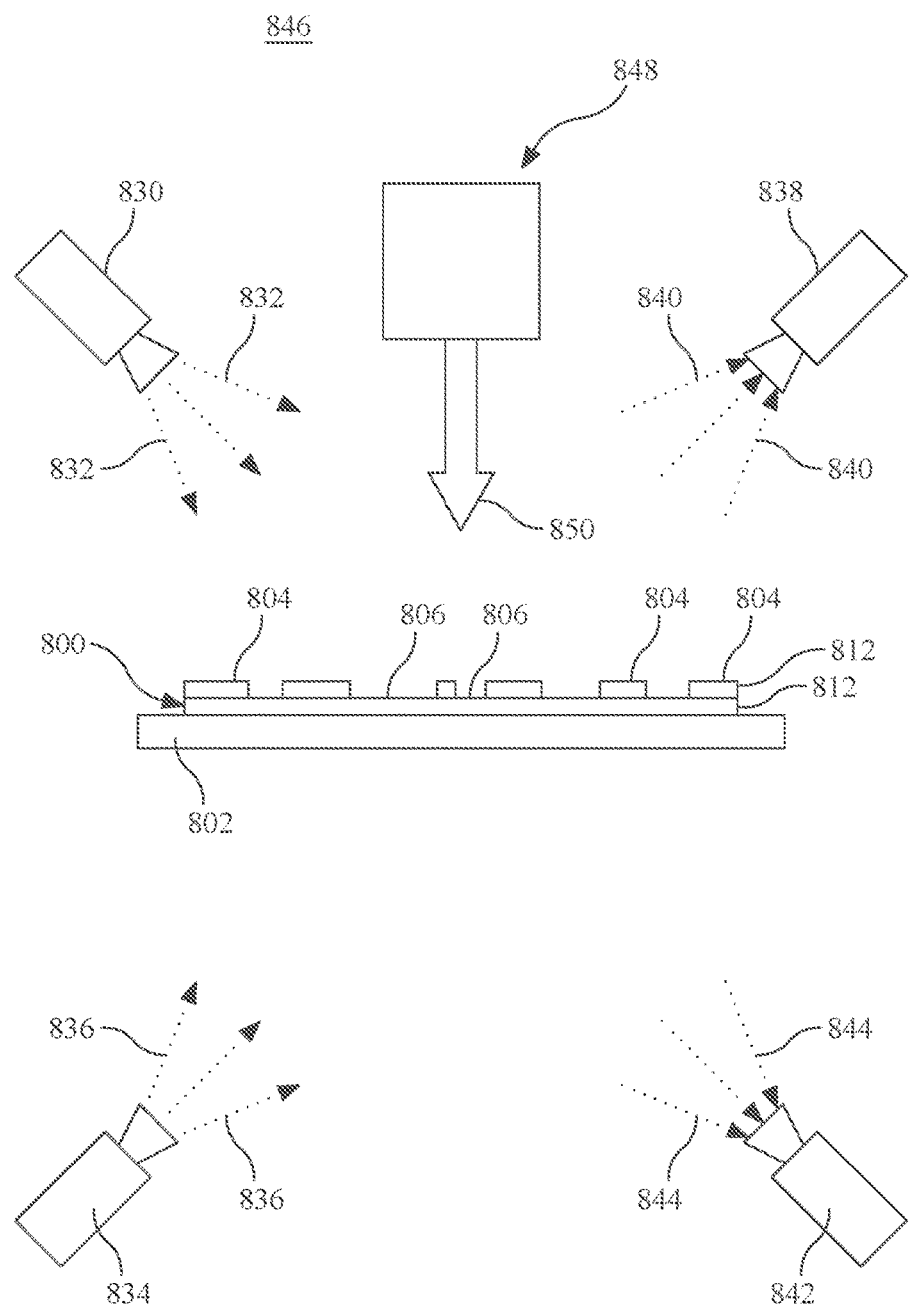
FIG. 8 is a schematic representation illustrating an embodiment of a labeling system for labeling and object and reader the object label.

Referring to FIG. 8, exemplary embodiments include a system for labeling an object 846. The system includes at least one object label 800 mounted on an object. 802. Any suitable object label described herein can be used. In general, the object label is constructed of a material that absorbs and reflects incident energy uniformly across all wavelengths of incident energy at a ratio proportional to a thickness of the material. For example, the energy uniformly absorbed or reflected across all wavelengths ranges from about 2% to about 3% of the incident energy. Uniform absorption and reflection of incident energy, which can be expressed as the extinction in transmission through the material, includes a variation of up to ±5% and preferably ±2% across all wavelengths of incident energy. A suitable range of wavelengths of incident energy includes, but is not limited to, from the microwave range to the ultraviolet range. While the material has uniform absorption across all wavelengths, the material can be configured to have a peak absorption across a small band of portion of all of the wavelengths. This peak absorption band can vary, i.e., increase or decrease in wavelength, with the number of layers. Suitable methods for obtaining this smaller range of peak wavelengths for absorption include providing a pattern in the material, for example, a microdisk array.

The absorption and reflection of incident energy, however, varies with the thickness of the material. Therefore, the material includes a plurality of layers 812, and the number of layers is varied to form a pattern that represents variations in the thickness of the material along at least one of two orthogonal directions across the label. As illustrated, the pattern includes a first thickness 804 and areas of a second thickness 806 that is less than the first thickness.

In one embodiment, the labeling system includes a plurality of object labels. In one embodiment, each object label includes an identical pattern. Therefore, multiple labels can be provided on a single object. Alternatively, multiple objects can be associated with a single pattern, e.g., multiple components of an automobile having a common label associated with the vehicle identification number of that automobile. In one embodiment, each object label includes a unique pattern. Therefore, a given object can have multiple unique associated object labels or a unique object label can be associated with each one of a plurality of unique objects.

In one embodiment, the system includes a label attachment mechanism 848 for attaching the object label 850 to the desired surface of the object. In one embodiment, the object label is created and then is attached to the surface of the object. For example, a process such as crystalline epitaxy can be used to create the object label on a first metal surface. The object label is then removed from this surface and placed on the surface of the object. Alternatively, the object label is formed directly on the surface of the object. In one embodiment, the label attachment mechanism includes a vapor deposition system or chemical vapor deposition system to create the pattern while depositing the material on the object. Suitable vapor deposition systems are known and available in the art. The resulting pattern on the object label can be formed or created after the material is deposited on the object, for example, using a laser etching process. Alternatively, the label pattern is formed during the creation of the object label. In one embodiment, the label is formed as a random pattern in the material resulting from the deposition process. The deposition process is capable of produces millions of random label patterns.

The system includes at least one interrogator 830 to direct a predetermined wavelength of radiation 832 to the at least one object label 800. The radiation is incident on the various thicknesses of the object label and is selectively absorbed and reflected based on the thicknesses of the material at any given location on the object label. In particular, thinner layers of material will absorb less and reflect more incident energy. The system includes at least one reader 838 to receive reflected radiation 840 from the at least one object label at the predetermined wavelength. The reader interprets the reflected radiation to recognize the pattern. In particular the reader looks at the amount of energy reflected from the different locations on the object label. These energy differences show the pattern associated with the object label. The predetermined wavelength of radiation is selected to be transparent to any structures between the interrogator and reader and the object label. In addition, the predetermined wavelength is selected based on the smallest area or length of material thickness in the object label that is to be resolved by the reader. In one embodiment, the predetermined wavelength is smaller than the smallest feature that is to be resolved by the reader.

The interrogator and reader are placed at any angle to the surface of the object label sufficient to communicate the wavelengths of energy from the interrogator and the reader and to revolve the reflected energies from different thicknesses of the object label. In addition, the interrogator and reader do not have to be located such that the label is between these structures and the object. In one embodiment, the system includes at least one second interrogator 834 to direct a second predetermined wavelength of radiation 836 to the at least one object label 800 from a side opposite the first interrogator. This object is transparent to this second predetermined wavelength of radiation, and the second predetermined wavelength of radiation can be the same as or different from the first predetermined wavelength of radiation 832. The second predetermined wavelength of radiation is incident on the various thicknesses of the object label and is selectively absorbed and reflected based on the thicknesses of the material at any given location on the object label. Again, thinner layers of material will absorb less and reflect more incident energy. The system includes at least one second reader 842 to receive reflected radiation 844 from the at least one object label at the predetermined wavelength. The second reader is also located on an opposite side of the label and object from the first reader 838.

Figure 9:
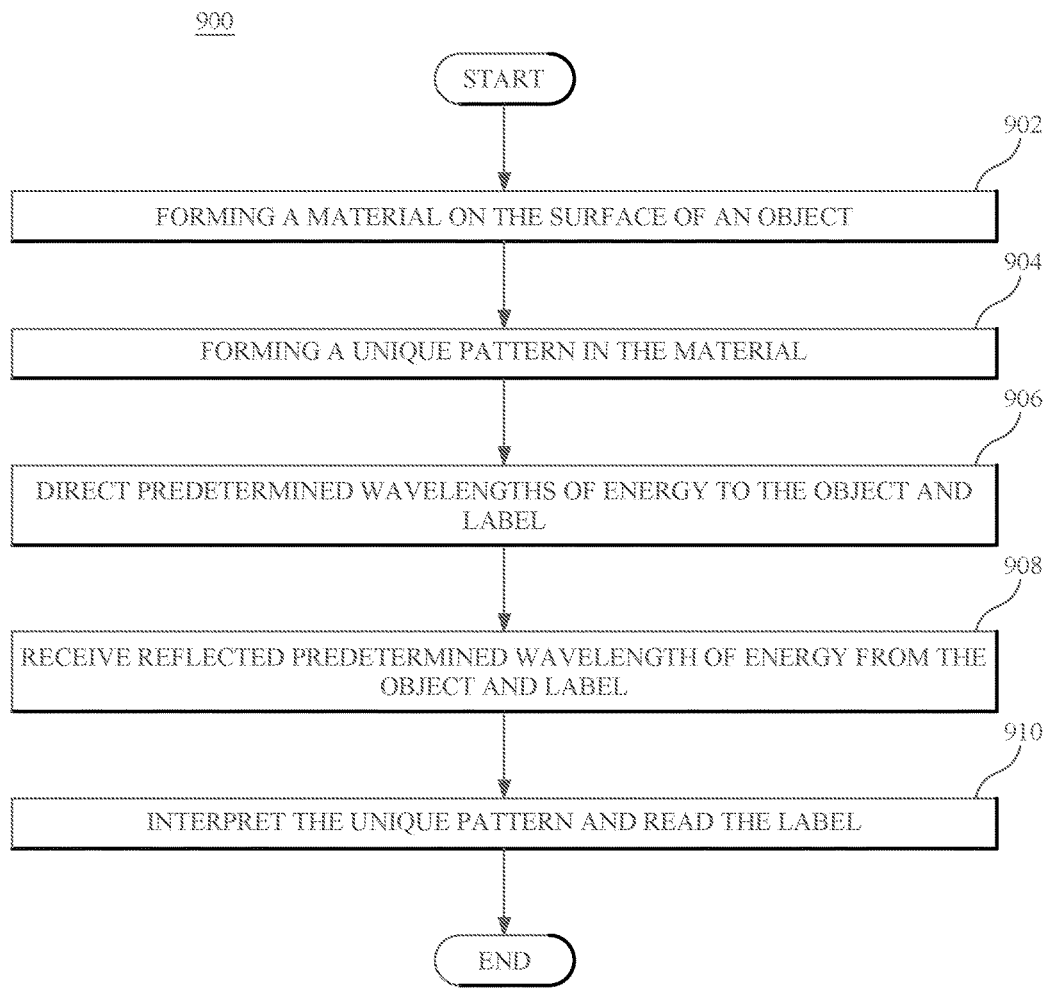
FIG. 9 is a flow chart illustrating an embodiment of a method for labeling an object.

Referring to FIG. 9, exemplary embodiments are directed to a method for labeling an object 900 using any one of the object labels and object labeling systems are disclosed herein. In one embodiment, a material is formed on the surface of the object 902, including both interior and exterior surfaces of that object. In one embodiment, the material is formed on an interior surface of the object, and the object has optically opaque exterior surfaces. The material is preferably graphene, and the material is formed to have at least two or alternatively a plurality of layers. The material and in particular the graphene absorbs and reflects incident energy uniformly across all wavelengths of incident energy at a ratio proportional to the number of layers of the material or graphene. Decreasing the number of layers decreases the amount of energy absorbed and increases the amount of energy reflected by the material.

A unique pattern is formed in the material 904. This unique pattern includes variations in the number of layers of the material or graphene along at least one of two orthogonal directions across the material or object label. The pattern can be formed during deposition of the material or after the material is formed on the object. In one embodiment, vapor deposition is used to form the at least two layers of material or graphene and to form the unique pattern in the material.

A predetermined wavelength of energy is directed to the object and label 906, and the reflected predetermined wavelength of energy is received from the object and label 908. In one embodiment, the predetermined wavelength or wavelengths of energy are reflected by the object and are absorbed by the material of the label as the incident and reflected energy passes through the label. The unique pattern of the object label is interpreted and the object label is read 910. The unique pattern is interpreted by looking at the amount of energy reflected from different locations of the object label and seeing the pattern sketched by these different amounts of energy at different locations.

As will be appreciated by one skilled in the art, aspects of the present invention may be embodied as a system, method or computer program product. Accordingly, aspects of the present invention may take the form of an entirely hardware embodiment or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to apparatus (systems) and computer program products according to embodiments of the invention. It will be understood that each description and illustration can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the block diagram block or blocks.

The schematic illustrations and block diagrams in the Figures illustrate the architecture, functionality, and operation of possible implementations of systems, methods and computer program products according to various embodiments of the present invention. In this regard, each block in the block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams, and combinations of blocks in the block diagrams, can be implemented by special purpose hardware-based systems that perform the specified functions or acts, or combinations of special purpose hardware and computer instructions.

Methods and systems in accordance with exemplary embodiments of the present invention can take the form of an entirely hardware embodiment, an entirely software embodiment or an embodiment containing both hardware and software elements. In a preferred embodiment, the invention is implemented in software, which includes but is not limited to firmware, resident software and microcode. In addition, exemplary methods and systems can take the form of a computer program product accessible from a computer-usable or computer-readable medium providing program code for use by or in connection with a computer, logical processing unit or any instruction execution system. For the purposes of this description, a computer-usable or computer-readable medium can be any apparatus that can contain, store, communicate, propagate, or transport the program for use by or in connection with the instruction execution system, apparatus, or device. Suitable computer-usable or computer readable mediums include, but are not limited to, electronic, magnetic, optical, electromagnetic, infrared, or semiconductor systems (or apparatuses or devices) or propagation mediums. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

Suitable data processing systems for storing and/or executing program code include, but are not limited to, at least one processor coupled directly or indirectly to memory elements through a system bus. The memory elements include local memory employed during actual execution of the program code, bulk storage, and cache memories, which provide temporary storage of at least some program code in order to reduce the number of times code must be retrieved from bulk storage during execution. Input/output or I/O devices, including but not limited to keyboards, displays and pointing devices, can be coupled to the system either directly or through intervening I/O controllers. Exemplary embodiments of the methods and systems in accordance with the present invention also include network adapters coupled to the system to enable the data processing system to become coupled to other data processing systems or remote printers or storage devices through intervening private or public networks. Suitable currently available types of network adapters include, but are not limited to, modems, cable modems, DSL modems, Ethernet cards and combinations thereof.

In one embodiment, the present invention is directed to a machine-readable or computer-readable medium containing a machine-executable or computer-executable code that when read by a machine or computer causes the machine or computer to perform a method for labeling an object and reading an object in accordance with exemplary embodiments of the present invention and to the computer-executable code itself. The machine-readable or computer-readable code can be any type of code or language capable of being read and executed by the machine or computer and can be expressed in any suitable language or syntax known and available in the art including machine languages, assembler languages, higher level languages, object oriented languages and scripting languages. The computer-executable code can be stored on any suitable storage medium or database, including databases disposed within, in communication with and accessible by computer networks utilized by systems in accordance with the present invention and can be executed on any suitable hardware platform as are known and available in the art including the control systems used to control the presentations of the present invention.

While it is apparent that the illustrative embodiments of the invention disclosed herein fulfill the objectives of the present invention, it is appreciated that numerous modifications and other embodiments may be devised by those skilled in the art. Additionally, feature(s) and/or element(s) from any embodiment may be used singly or in combination with other embodiment(s) and steps or elements from methods in accordance with the present invention can be executed or performed in any suitable order. Therefore, it will be understood that the appended claims are intended to cover all such modifications and embodiments, which would come within the spirit and scope of the present invention.

What is claimed is:

1. An object label comprising:
    a plurality of individual layers of a material that is transparent in a visible light domain and absorbs incident energy outside the visible light domain at a ratio proportional to a thickness of the material; and
    a pattern comprising variations in the thickness of the material along at least one of two orthogonal directions across the label, the pattern readable by variations in an amount of energy outside the visible light domain reflected through the object label.

2. The object label of claim 1, wherein the object label comprises an overall thickness of less than about 5 nm.

3. The object label of claim 1, wherein the material absorbs and reflects incident energy uniformly across all wavelengths of incident energy.

4. The object label of claim 1, wherein the variations in the thickness of the material comprise changes in a number of individual layers of the material.

5. The object label of claim 4, wherein the changes in the number of individual layers of the material comprise a single layer change in the number of individual layers.

6. The object label of claim 1, wherein the material comprises graphene.

7. An object label comprising:
    a material that absorbs energy at a ratio proportional to a thickness of the material; and
    a pattern comprising a unique identifier for the object label that is a unique two-dimensional pattern created by variations in the thickness of the material along at least one of two orthogonal direction across the label and that can be read by energy reflected through the label;
    wherein the object label comprises an area of less than about 1000 $\mu m^2$ and variations in the thickness of the material comprise changes in a number of individual layers of the material.

8. The object label of claim 7, wherein the material comprises graphene.

9. The object label of claim 7, wherein the material absorbs and reflects incident energy uniformly across all wavelengths of incident energy.

10. The object label of claim 7, wherein the object label is optically transparent.

11. The object label of claim 7, wherein the pattern is readable by variations in an amount of energy outside the visible light domain reflected through the object label.

12. The object label of claim 7, wherein the label comprises a plurality of individual vapor deposited layers of the material.

13. A system for labeling an object, the system comprising:
    at least one object label comprising:
        a plurality of individual layers of a material that absorbs and reflects incident energy uniformly across all wavelengths of incident energy at a ratio proportional to a thickness of the material; and
        a pattern comprising variations in the thickness of the material along at least one of two orthogonal directions across the label;

an interrogator to direct a predetermined wavelength of radiation to the at least one label; and a reader to receive reflected radiation from the at least one label at the predetermined wavelength and to interpret the reflected radiation to recognize the pattern;

wherein the object label comprises an overall thickness of less than about 5 nm and an area of less than about 1000 $\mu m^2$ and variations in the thickness of the material comprise changes in the number of individual layers of the material.

14. The system of claim 13, wherein the system further comprises a vapor deposition system to create the pattern while depositing the material on the object.

15. The system of claim 13, wherein the system further comprises a plurality of object labels, each object label comprising a unique pattern and associated with a unique object.

16. The system of claim 13, wherein the material comprises graphene.

17. The system of claim 13, wherein:

the predetermined wavelength is outside the visible light spectrum; and the reader interprets the reflected radiation to recognize the pattern as variations in an amount of energy of the predetermined wavelength reflected through the object label.

* * * * *